(12) United States Patent
Tamaki et al.

(10) Patent No.: US 12,462,992 B2
(45) Date of Patent: Nov. 4, 2025

(54) ELECTRONIC DEVICE

(71) Applicant: Sony Interactive Entertainment Inc., Tokyo (JP)

(72) Inventors: Yuta Tamaki, Chiba (JP); Hironobu Endo, Tokyo (JP); Yasuhiro Ootori, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 33 days.

(21) Appl. No.: 17/910,203

(22) PCT Filed: Mar. 23, 2021

(86) PCT No.: PCT/JP2021/011969
§ 371 (c)(1),
(2) Date: Sep. 8, 2022

(87) PCT Pub. No.: WO2021/193623
PCT Pub. Date: Sep. 30, 2021

(65) Prior Publication Data
US 2023/0110303 A1    Apr. 13, 2023

(30) Foreign Application Priority Data
Mar. 27, 2020 (JP) .................. 2020-059188

(51) Int. Cl.
*H01H 13/14* (2006.01)
*H01H 13/20* (2006.01)
*H05K 1/18* (2006.01)

(52) U.S. Cl.
CPC ............ *H01H 13/14* (2013.01); *H01H 13/20* (2013.01); *H05K 1/181* (2013.01); *H05K 2201/10053* (2013.01); *H05K 2201/10098* (2013.01)

(58) Field of Classification Search
CPC .. H01H 13/14; H01H 13/20; H01H 2221/026; H01H 2221/044;
(Continued)

(56) References Cited

U.S. PATENT DOCUMENTS 6,998,554 B2 * 2/2006 Shimoda .................. B60Q 3/82
200/341
7,592,559 B2 * 9/2009 Blake, III .............. H01H 13/14
200/341
(Continued)

FOREIGN PATENT DOCUMENTS

| JP | S6355338 U | 4/1988 |
| JP | 2172115 A | 7/1990 |
| JP | 2015060685 A | 11/2014 |

OTHER PUBLICATIONS

International Preliminary Report on Patentability and Written Opinion for corresponding PCT Application No. PCT/2021/011969, 5 pages, dated Oct. 6, 2022.
(Continued)

*Primary Examiner* — Lheiren Mae A Caroc
(74) *Attorney, Agent, or Firm* — Kilpatrick Townsend & Stockton LLP

(57) ABSTRACT

Buttons (41A, 41B) have a button moving part (42) disposed in front of a circuit board (51) and allowed to move in a front-back direction, and guided parts (42e) moving in conjunction with the button moving part (42). The buttons (41A, 41B) cause the button moving part (42) to operate a switch (52) of the circuit board (51). Guide parts (21E, 21F) are disposed along the guided parts (42e) and restrict the direction in which the button moving part (42) moves. The guide parts (21E, 21F) and the guided parts (42e) have portions located back of a front surface (51a) of the circuit
(Continued)

board (51). This structure effectively prevents the buttons from tilting when they are operated.

19 Claims, 12 Drawing Sheets

(58) Field of Classification Search
CPC ........... H01H 2221/058; H01H 13/705; H05K 1/181; H05K 2201/10053; H05K 2201/10098; H05K 1/18; H05K 7/12
See application file for complete search history.

(56) References Cited

U.S. PATENT DOCUMENTS

| | | | |
|---|---|---|---|
| 8,816,231 B2* | 8/2014 | Shen .................... | H01H 13/705 |
| | | | 200/345 |
| 11,735,380 B2* | 8/2023 | Yang ..................... | H01H 13/20 |
| | | | 200/341 |

OTHER PUBLICATIONS

International Search Report for corresponding PCT Application No. PCT/2021/011969, 4 pages, dated Jun. 22, 2021.
Notice of Reasons for Refusal for corresponding JP Application No. 2022-510541, 13 pages, dated Nov. 5, 2024.

* cited by examiner

ELECTRONIC DEVICE

TECHNICAL FIELD

The present invention relates to a support structure for buttons of an electronic apparatus.

BACKGROUND ART

Many electronic apparatuses have, on their outer surface, an input member for operating a power switch. Japanese Patent Laid-open No. 2015-60685 discloses an electronic apparatus having a pushbutton serving as such an input member. The pushbutton is disposed in front of the switch and fitted in an opening formed on the front wall of the electronic apparatus.

SUMMARY

Depending on its shape and size, the button may slightly tilt when being pushed. This can lead to a positional shift between the button and the switch.

An electronic apparatus proposed in the present disclosure includes a circuit board and a button. The circuit board includes a first surface facing in a first direction, a second surface facing in a second direction opposite to the first direction, and a switch mounted on the first surface. The button includes a moving part and a guided part, the moving part being disposed in the first direction with respect to the switch and allowed to move in the first direction and the second direction, the guided part moving in conjunction with the moving part, the button causing the moving part to operate the switch. The electronic apparatus is formed along the guided part and restricts the direction in which the moving part moves. The guide part and the guided part each have a portion positioned more in the second direction than in the direction of the first surface of the circuit board. This electronic apparatus effectively prevents the button from tilting.

DESCRIPTION OF EMBODIMENT

Figure 1:
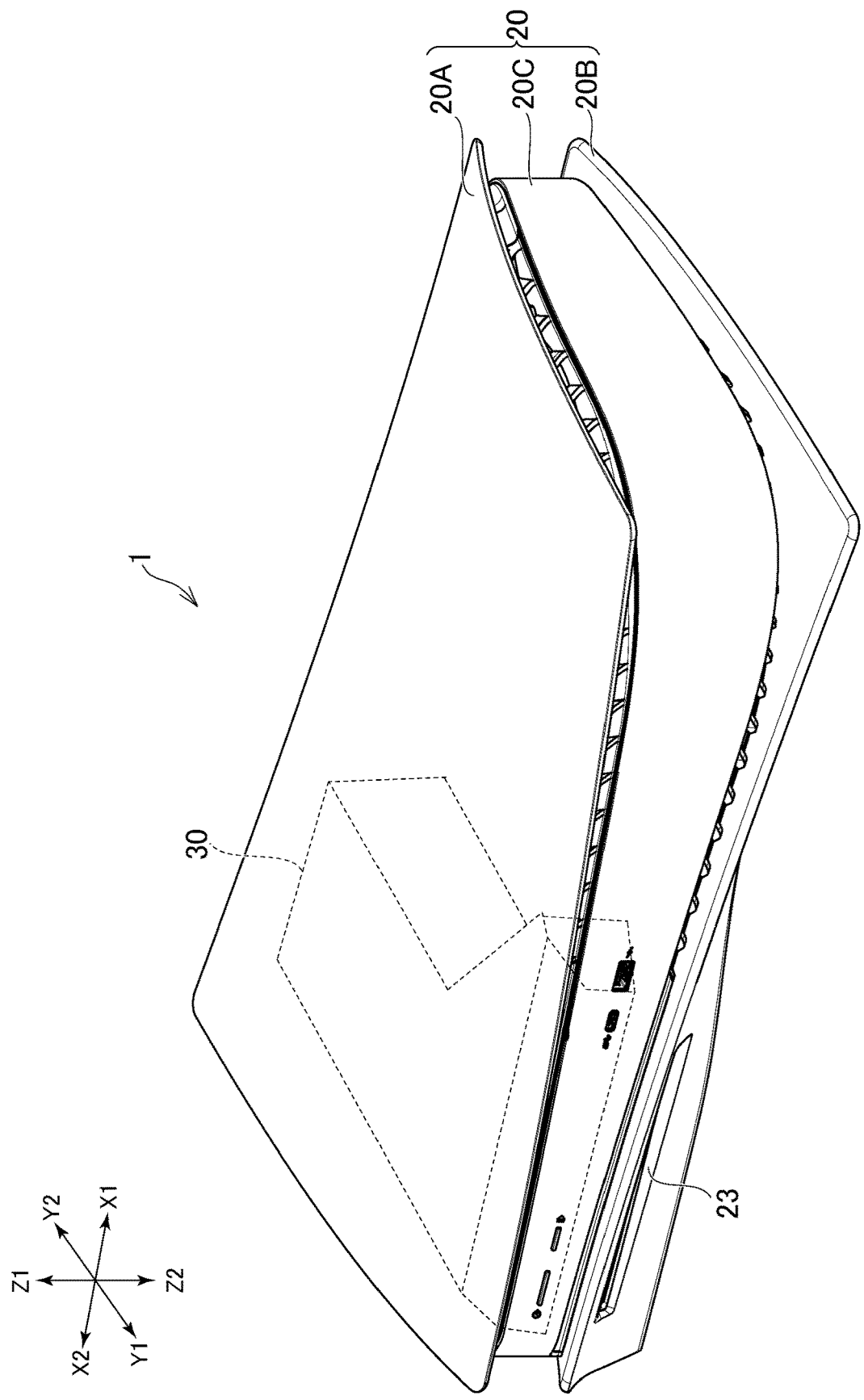
FIG. 1 is a perspective view depicting an exemplary electronic apparatus proposed in the present disclosure.

An embodiment of the present disclosure is described below with reference to the accompanying drawings. FIG. 1 and other drawings depict an electronic apparatus 1 as one such embodiment. In FIG. 1, X1 and X2 stand for the right side and the left side, Y1 and Y2 for the front side and the back side, and Z1 and Z2 for the upper side and the lower side, respectively, for the description that follows. It is to be noted that these directions are defined with a view to explaining the shapes, relative positional relations, and movements of the elements (parts, members, and other portions) constituting the electronic apparatus 1 and do not restrict the posture of the electronic apparatus 1 in use. For example, although FIG. 1 indicates the electronic apparatus 1 in a horizontal posture, the electronic apparatus 1 may alternatively be in a vertical posture when in use ("vertical posture" means a posture in which the right side or the left side of the electronic apparatus 1 comes at the bottom).

For example, the electronic apparatus 1 may be an entertainment apparatus that functions as a game console or an audio-visual device. The electronic apparatus 1 outputs moving image data generated by execution of game programs, video-audio data acquired via networks, or video-audio data obtained from recording media such as optical disks, to a display apparatus such as a television (TV) set. The electronic apparatus 1 may alternatively be a personal computer. As a further alternative, the electronic apparatus 1 may be a monitor apparatus such as a TV set, a digital camera, or a server apparatus. The electronic apparatus 1 is a device that has buttons manually operated by a user.

[Overall Configuration]

Figure 2:
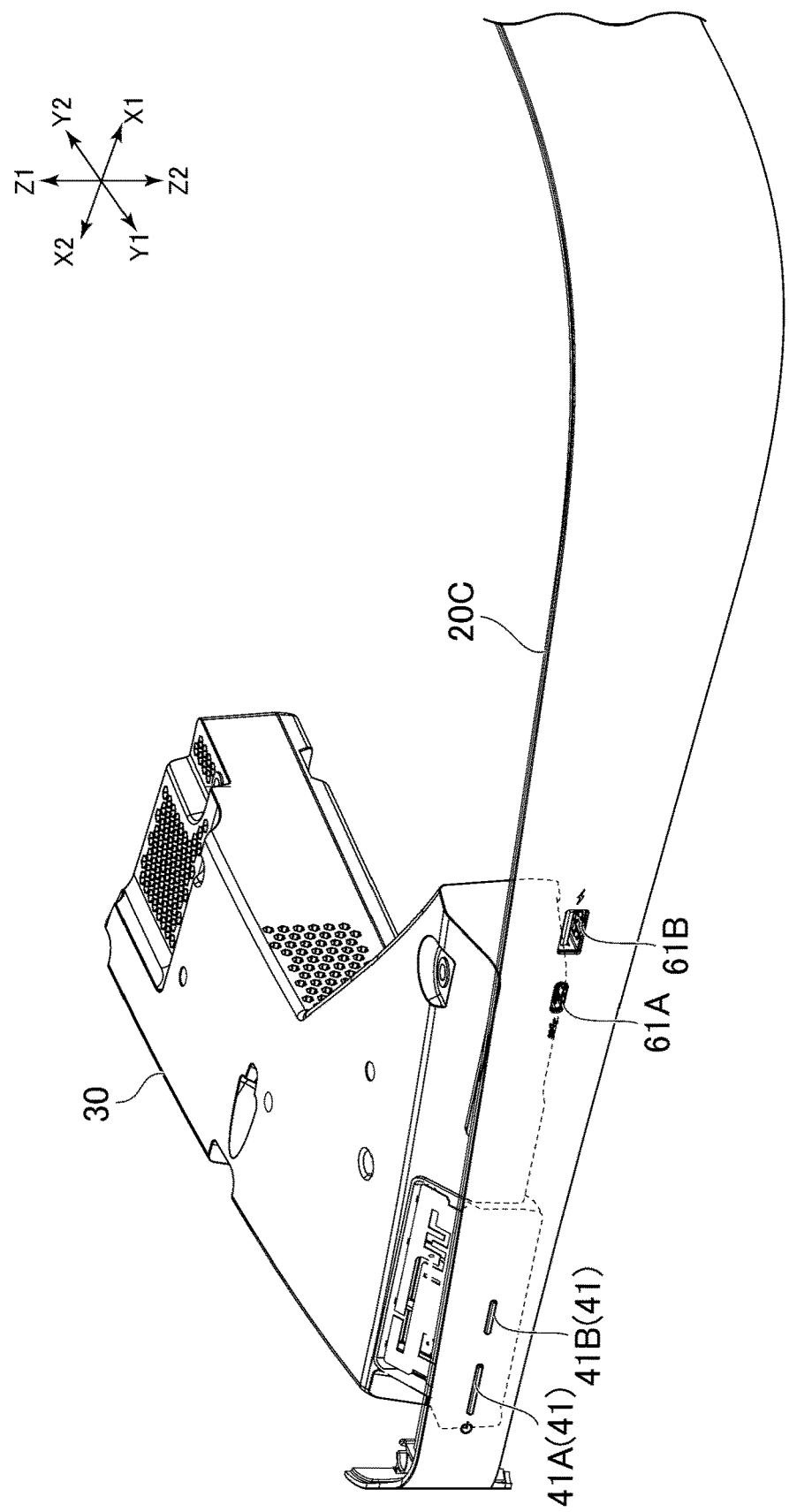
FIG. 2 is a perspective view of a front panel and a power supply unit.

As depicted in FIG. 1, the electronic apparatus 1 has sheathing members 20. The sheathing members 20 include, for example, an upper panel 20A and a lower panel 20B respectively constituting the upper side and the lower side of the electronic apparatus 1. The sheathing members 20 further include a front panel 20C constituting the front face of the electronic apparatus 1. Inside the sheathing members 20 are circuit boards, heat radiators for cooling integrated circuits such as the central processing unit (CPU), and a cooling fan. FIGS. 1 and 2 depict a power supply unit 30 as an exemplary apparatus housed in the sheathing members 20. Given power from an external power source, the power supply unit 30 generates drive power for driving the circuit boards and the cooling fan. The front panel 20C is disposed in front of the power supply unit 30.

[Overview of the Buttons]

As depicted in FIG. 2, the electronic apparatus 1 has two buttons 41A and 41B on its front face. The first button 41A is, for example, a power button for activating the electronic apparatus 1. The second button 41B is, for example, an eject button for ejecting an optical disk. The electronic apparatus 1 has a built-in optical disk drive. A loaded optical disk may be ejected from an insertion opening 23 (see FIG. 1) by operation of the second button 41B. The functions of the buttons 41A and 41B are not limited to those explained here by way of example.

The electronic apparatus 1 may not have the optical disk drive. In this case, the electronic apparatus 1 may have only one button (power button). As depicted in FIG. 2, the two buttons 41A and 41B are arrayed side by side in a horizontal direction, for example. The layout of the buttons 41A and 41B is not limited to that in the drawing. Alternatively, the first button 41A may be disposed on the upper side of the electronic apparatus 1, and the second button 41B may be located on the front face.

The buttons 41A and 41B are configured substantially the same. In the ensuing description where the two buttons 41A and 41B are not distinguished from each other, they will be designated by the reference sign 41.

Figure 4A:
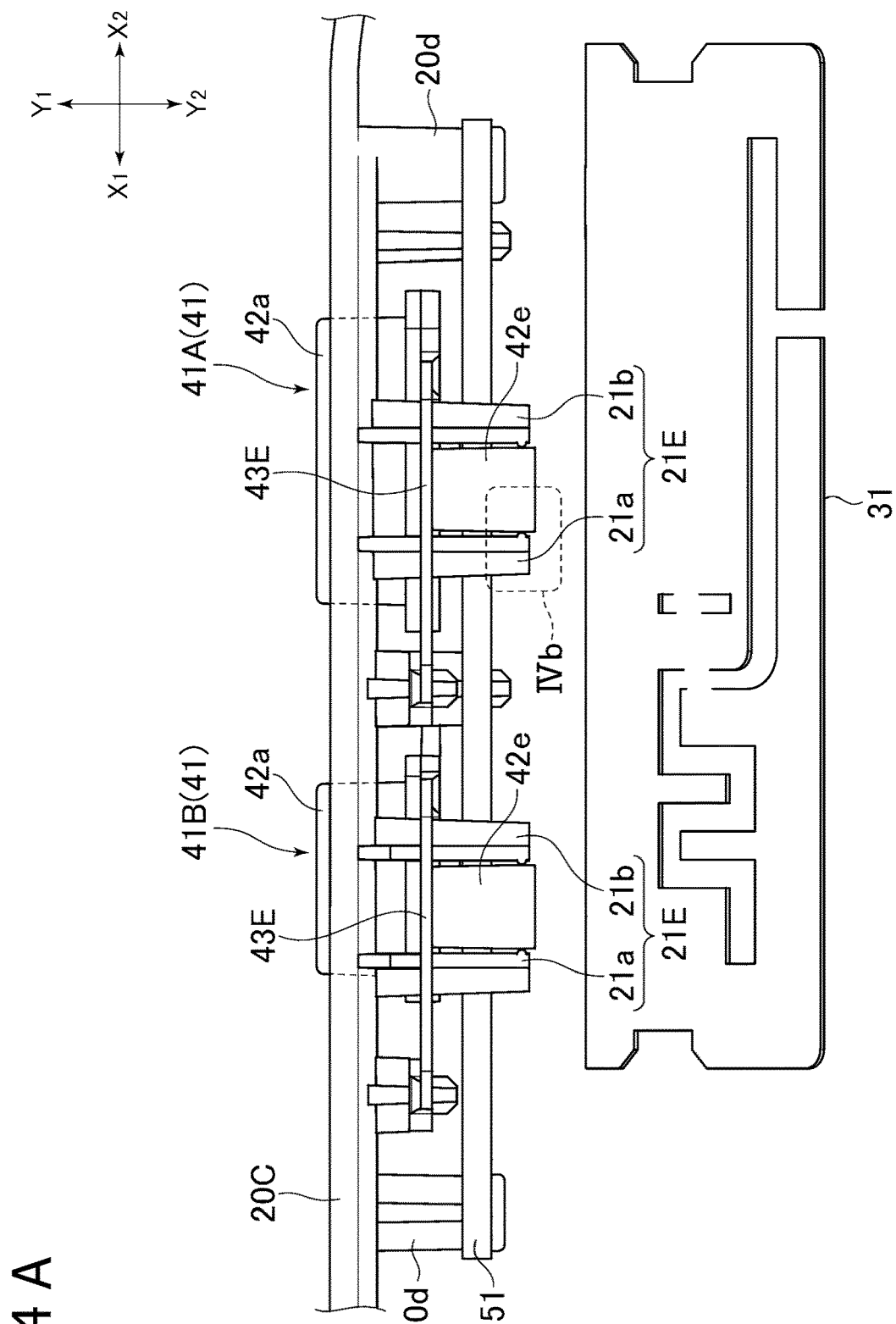
FIG. 4A is a plan view of the front panel, buttons, and an antenna (as viewed in the direction indicated by IV in FIG. 3).
Figure 5:
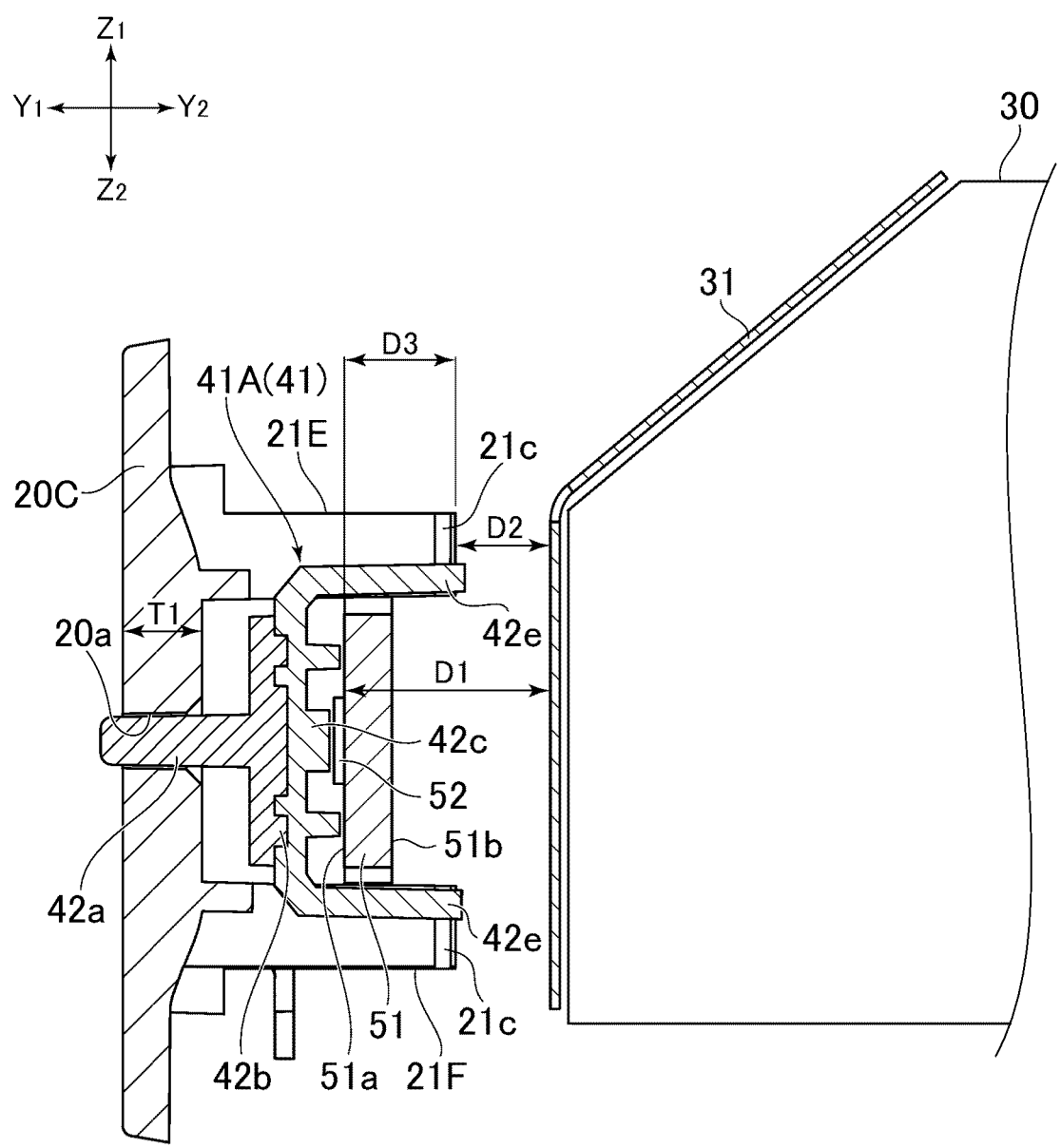
FIG. 5 is a cross-sectional view taken along line V-V in FIG. 3.

The electronic apparatus 1 has a circuit board 51 as depicted in FIGS. 4A and 5. The circuit board 51 is electrically connected, via a flat cable for example, with a circuit board (main circuit board) on which the CPU and other parts are mounted. The front panel 20C is disposed in a manner covering a front surface 51a of the circuit board 51. The front surface 51a of the circuit board 51 is furnished with two switches 52 that are respectively operated by two buttons 41A and 41B. The switches 52 each act as an on-off switchable switch when being pushed. For example, membrane switches or tactile switches may be used as the switches 52.

Figure 6A:
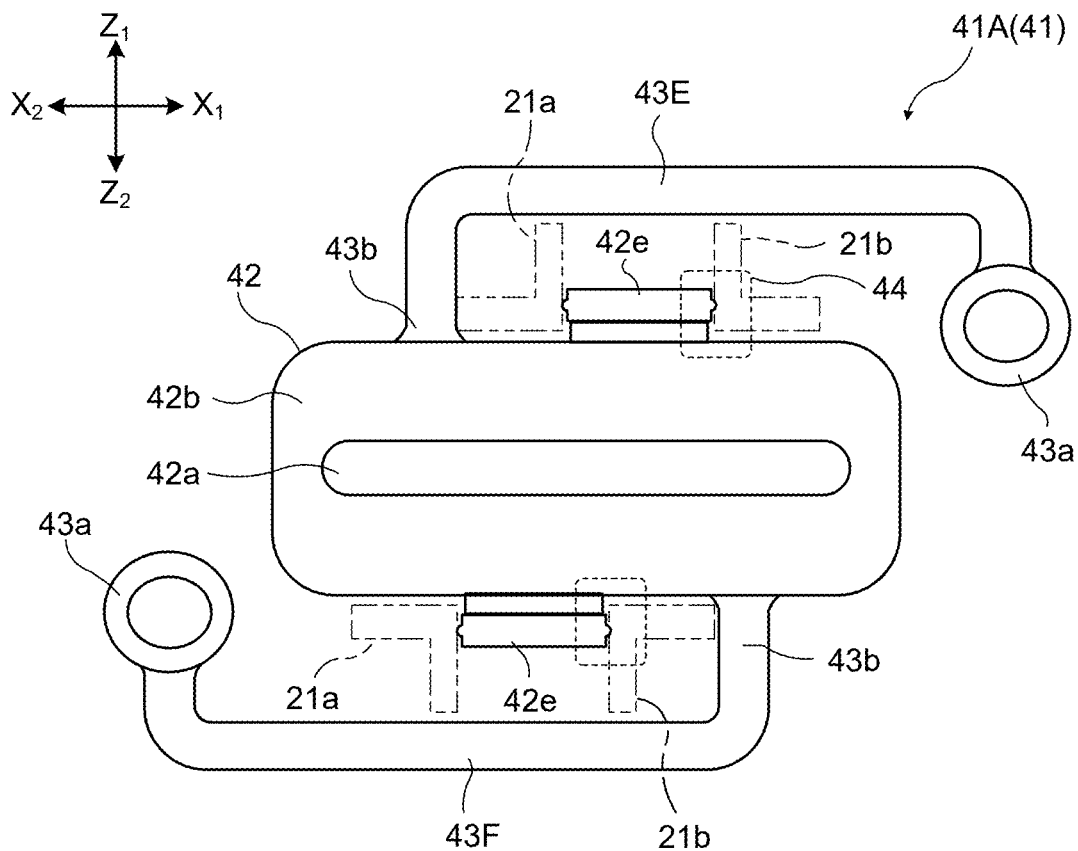
FIG. 6A is a front view of the buttons.

As depicted in FIG. 6A, the buttons 41 have a button moving part 42 positioned in front of the switches 52 and elastic parts 43E and 43F that extend from the button moving part 42 and are connected with the front panel 20C. The button moving part 42 can move in the thickness direction of the circuit board 51 (front-back direction of the electronic apparatus 1). The elastic parts 43E and 43F support the button moving part 42 in a manner permitting its movement. The buttons 41A and 41B are made of an insulating material. For example, polycarbonate or acrylonitrile butadiene styrene (ABS) resin may be used as the insulating material. The buttons 41A and 41B may be formed with two kinds of materials. The buttons 41A and 41B may be integrally formed by resin. The buttons 41A and 41B may alternatively be configured with multiple parts connected with each other by such fixing implements as screws and bolts.

As depicted in FIG. 5, the front panel 20C has an opening 20a formed therethrough in the front-back direction. The button moving part 42 has an operable part 42a exposed through the opening 20a to the front side of the electronic apparatus 1. In the electronic apparatus 1, the button moving part 42 has a base 42b disposed along the back surface of the front panel 20C. The operable part 42a is projected forward from the front surface of the base 42b. The operable part 42a is fitted in the opening 20a formed through the front panel 20C, the front end of the operable part 42a jutting slightly from the front surface of the front panel 20C.

Figure 6D:
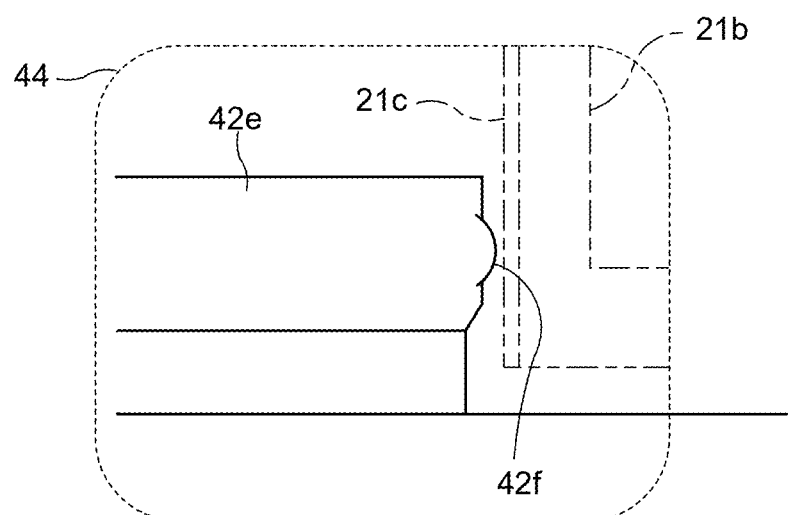
FIG. 6D is a front view of the buttons according to an example.
Figure 6B:
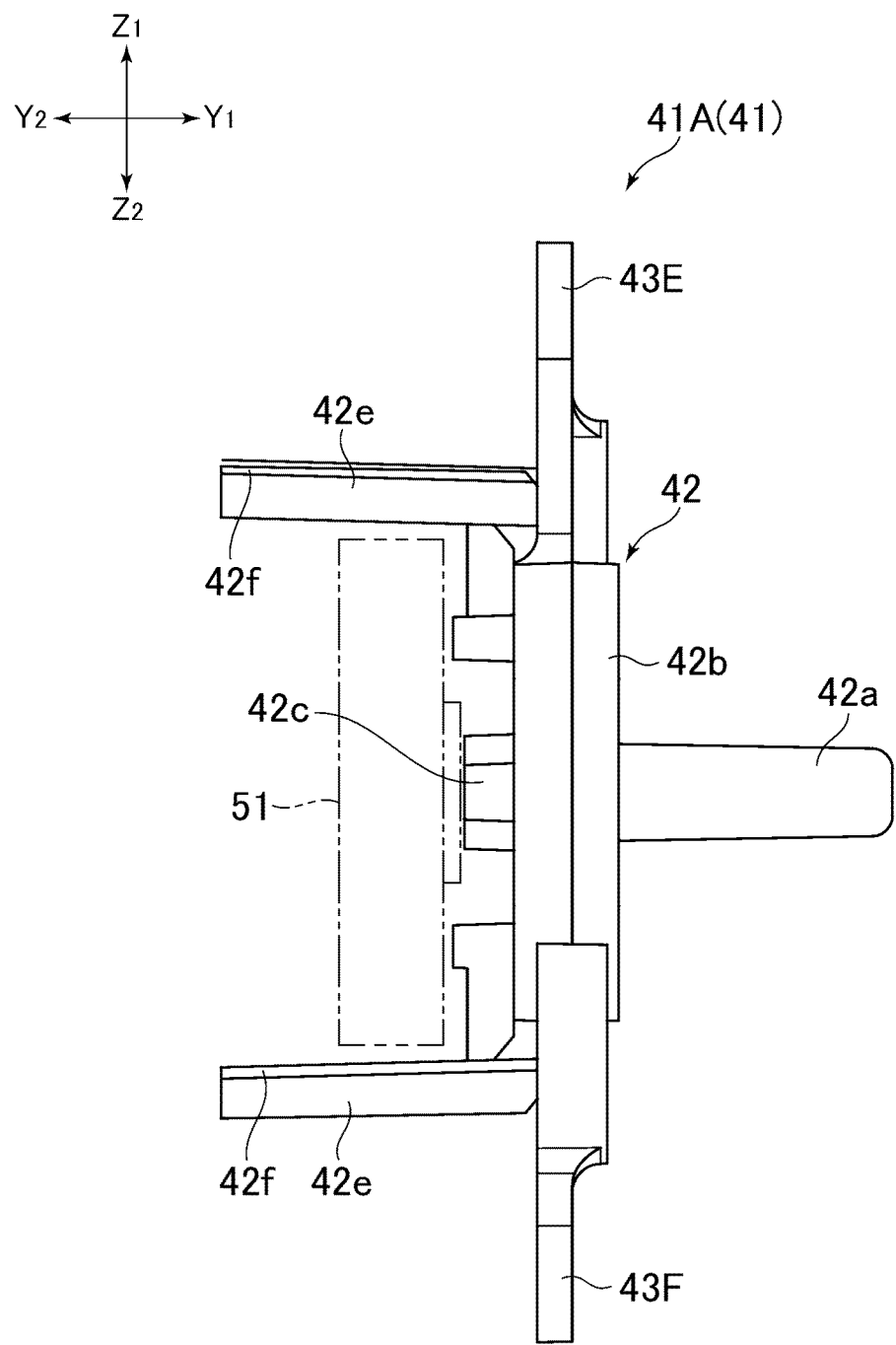
FIG. 6B is a side view of the buttons.

As depicted in FIG. 6B, a pushing part 42c jutting backward may be formed on the back surface of the button moving part 42. The pushing part 42c is positioned straight in front of the switches 52. When pushed by a user, the button moving part 42 causes the pushing part 42c to push the switches 52. Alternatively, the button moving part 42 may not have the pushing part 42c. In this case, the button moving part 42 may push the switches 52 with its back surface.

[Guide Parts and Guided Parts]

Figure 6C:
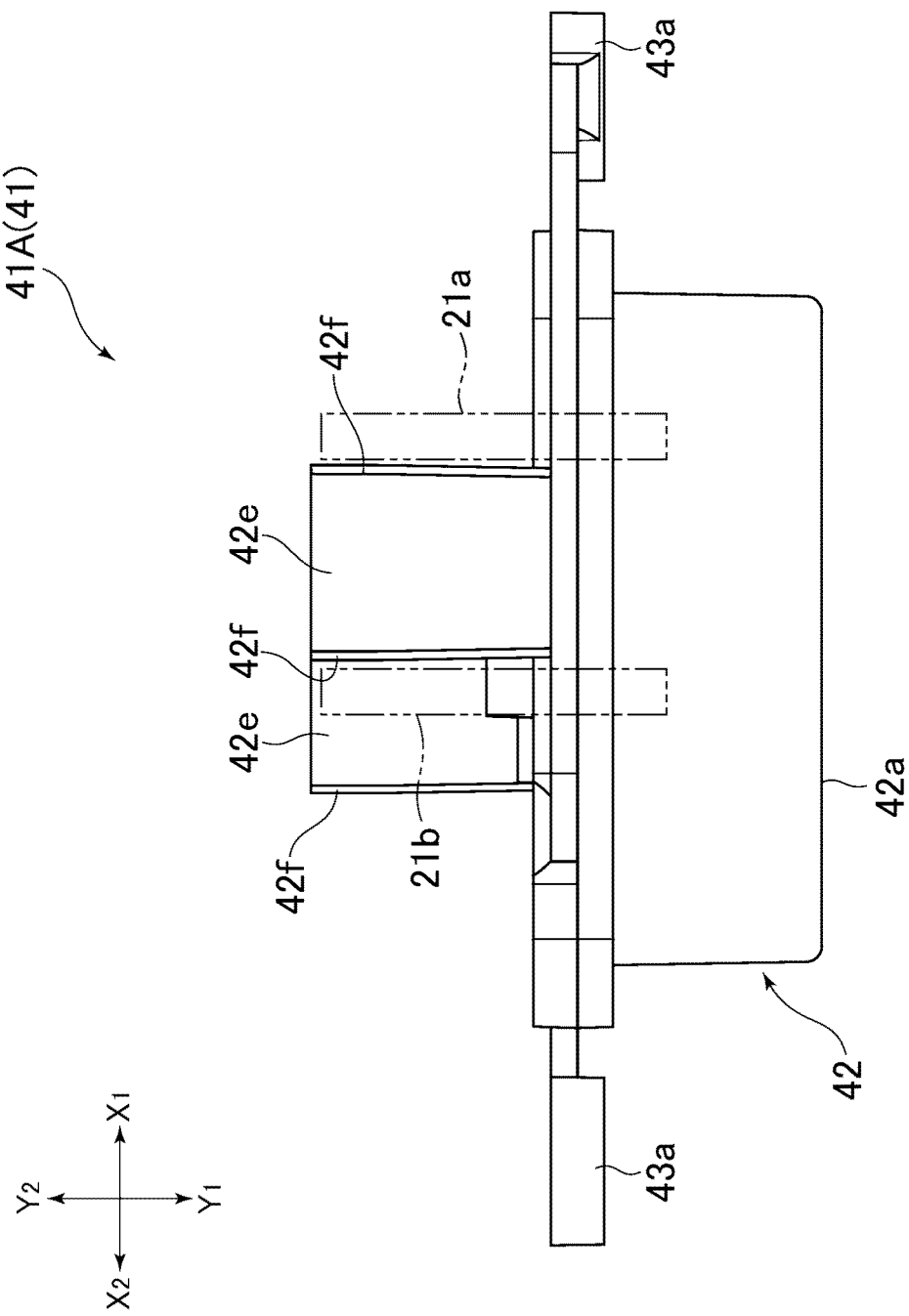
FIG. 6C is a plan view of the buttons.

The buttons 41 have guided parts 42e (see FIGS. 6B and 6C) that move in conjunction with the button moving part 42. In the electronic apparatus 1, two guided parts 42e are formed on the upper and lower edges of the button moving part 42 respectively. The two guided parts 42e face each other across the button moving part 42. The electronic apparatus 1 has guide parts 21E and 21F (see FIG. 5) respectively disposed along the two guided parts 42e. The guided parts 42e move along the guide parts 21E and 21F in the thickness direction (front-back direction) of the circuit board 51. This restricts the direction in which the button moving part 42 moves. In this illustrated example, as will be discussed later, the guide parts 21E and 21F have two lateral parts 21a and 21b (FIG. 4A) separated from each other in the horizontal direction. The guided parts 42e are disposed between the two lateral parts 21a and 21b. The guided parts 42e may be formed integrally with the button moving part 42 as depicted in FIG. 6B and in other drawings. Alternatively, the guided parts 42e may be formed separately from the button moving part 42 and attached thereto in a manner moving in conjunction therewith.

As depicted in FIGS. 4A and 5, the guide parts 21E and 21F are formed on the front panel 20C and extend therefrom in the backward direction. For each of the two buttons 41A and 41B, the front panel 20C has two guide parts 21E and 21F. The two guide parts 21E and 21F provided for each button 41 are formed separately from each other in the vertical direction, for example, in alignment with the two guided parts 42e (see FIG. 5).

Alternatively, the guided parts 42e may be positioned not on the upper and lower edges of the button moving part 42 but on the right and left edges thereof. The guide parts 21E and 21F may be formed in alignment with the positions of the guided parts 42e.

As depicted in FIG. 5, the guide parts 21E and 21F extend backward from the front panel 20C. The back ends of the guide parts 21E and 21F are positioned back of the front surface 51a of the circuit board 51. In the electronic apparatus 1, the guide parts 21E and 21F extend backward past the position of a back surface 51b of the circuit board 51. The back ends of the guide parts 21E and 21F are positioned back of the back surface 51b of the circuit board 51. In this manner, the guide parts 21E and 21F extending backward from the front panel 20C have a portion positioned in front of the front surface 51a of the circuit board 51 and a portion located back of the back surface 51b of the circuit board 51.

As depicted in FIG. 5, the guided parts 42e extend backward from the base 42b of the button moving part 42 past the back surface 51b of the circuit board 51. The guided parts 42e also have a portion positioned back of the back surface 51b of the circuit board 51. Further, the guided parts 42e, positioned back of the back surface 51b of the circuit board 51, are guided by the guide parts 21E and 21F. The back ends of the guided parts 42e may be positioned slightly back of the back ends of the guide parts 21E and 21F.

The guide parts 21E and 21F effectively prevent the button moving part 42 from tilting. More specifically, the distance in the front-back direction from the opening 20a formed on the front panel 20C to the back ends of the guide parts 21E and 21F is increased. This prevents the positions of the back ends of the buttons 41 (back ends of the guided parts 42e) from shifting in the horizontal direction, for example. As a result, the button moving part 42 is effectively prevented from tilting. Also, the length of the guide parts 21E and 21F is increased in the front-back direction. This also contributes to preventing the button moving part 42 from tilting.

As depicted in FIG. 5, an antenna 31 is disposed back of the circuit board 51. In the electronic apparatus 1, the antenna 31 is attached to the front surface of the power supply unit 30 disposed back of the circuit board 51. A distance D1 in the front-back direction from the front surface 51a of the circuit board 51 to the antenna 31 is longer than a distance D2 in the front-back direction from the back ends of the guide parts 21E and 21F (i.e., contact parts 21c, to be discussed later) to the antenna 31. This structure prevents noise from being generated in signals sent and received via the antenna 31, the noise being attributable to signals flowing through the circuit board 51, for example.

In the electronic apparatus 1, the back ends of the guide parts 21E and 21F are positioned back of the back surface 51b of the circuit board 51. Consequently, the distance in the front-back direction from the back surface 51b of the circuit board 51 to the antenna 31 is also longer than the distance D2 in the front-back direction from the back ends of the guide parts 21E and 21F to the antenna 31.

It is to be noted that the electrical part to be disposed back of the circuit board 51 may not be the antenna. In this case, noise is prevented from being generated in signals flowing through the electrical part, the noise being attributable to signals flowing through the circuit board 51.

As depicted in FIG. 5, a distance D3 in the front-back direction from the front surface 51a of the circuit board 51 to the back ends of the guide parts 21E and 21F (contact parts 21c, to be discussed later) may be greater than a thickness T1 of the front panel 20C.

Also, as depicted in FIG. 5, the distance D3 in the front-back direction from the front surface 51a of the circuit board 51 to the back ends of the guide parts 21E and 21F (contact parts 21c, to be discussed later) may be greater than a movable range of the button moving part 42.

The guide parts 21E and 21F may alternatively be formed on a member different from the front panel 20C. For example, the guide parts 21E and 21F may be formed on a member disposed back of the circuit board 51 or on a member mounted on the circuit board 51. In this case, the guide parts 21E and 21F need not have any portion located in front of the circuit board 51.

[Two Lateral Parts]

As depicted in FIG. 4A, the guide parts 21E and 21F may have two lateral parts 21a and 21b separated in the horizontal direction. The lateral parts 21a and 21b may each extend backward from the front panel 20C. Each of the guided parts 42e is flanked by the two lateral parts 21a and 21b. This effectively prevents the button moving part 42 from tilting.

In the electronic apparatus 1, the operable part 42a of the buttons 41 has a horizontally elongated shape (see FIG. 2). For this reason, there is a possibility that the user may press only a right portion or a left portion of the operable part 42a. In such a case, the two lateral parts 21a and 21b flanking the guided parts 42e still prevent effectively the button moving part 42 from tilting in the horizontal direction.

Unlike in the case of the electronic apparatus 1, the guided parts 42e instead of the guide parts 21E and 21F may be configured with two lateral parts separated in the horizontal direction. The guide parts 21E and 21F may then be disposed between these two lateral parts. This structure also prevents effectively the button moving part 42 from tilting in the horizontal direction.

[Contact Parts]

Figure 4B:
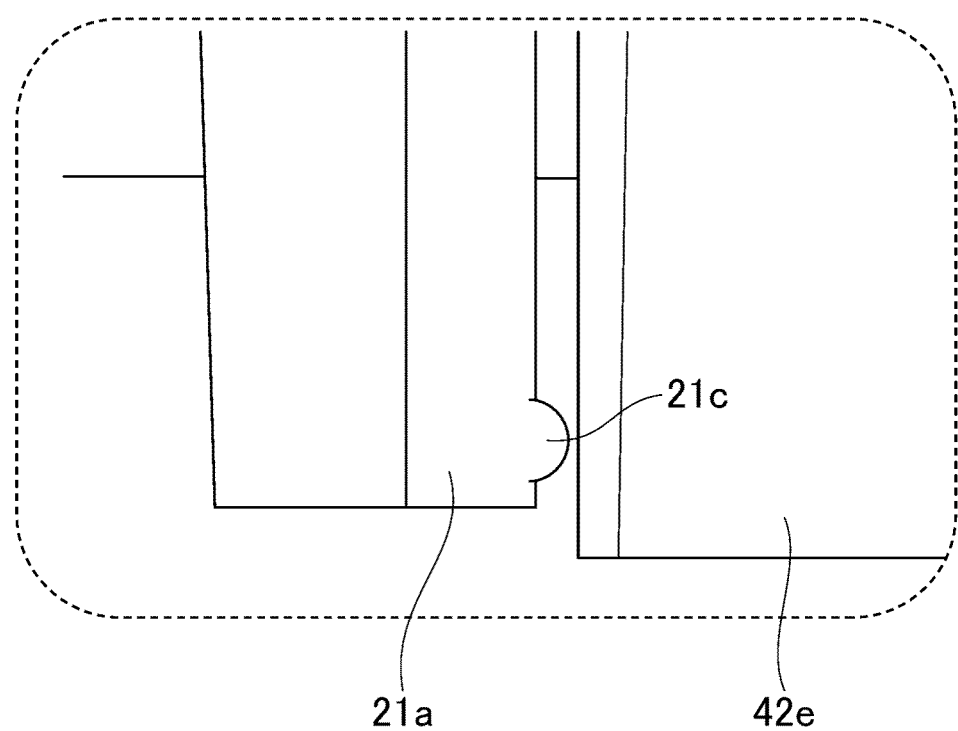
FIG. 4B is an enlarged view of a region indicated by IVb in FIG. 4A.

As depicted in FIG. 4B, contact parts 21c may be formed on the guide parts 21E and 21F in a manner projecting toward the guided parts 42e and being positioned back of the back surface 51b of the circuit board 51. The guide parts 21E and 21F may be in contact with the guided parts 42e via the contact parts 21c. In the electronic apparatus 1, the two lateral parts 21a and 21b (see FIG. 4A) constituting each of the guide parts 21E and 21F each have the contact part 21c formed in a manner projecting inward. It is via the contact parts 21c that the lateral parts 21a and 21b are in contact with the lateral parts of the guided parts 42e. The contact parts 21c may extend vertically at the back ends of the lateral parts 21a and 21b.

A right flank and a left flank of the guided parts 42e may have contact parts 42f formed to project rightward and leftward, respectively, as depicted in view 44 in FIG. 6A and 6D. The contact parts 42f extend in the front-back direction. The contact parts 21c of the guide parts 21E and 21F may be in contact with the contact parts 42f of the guided parts 42e. This structure reduces the contact area between the guide parts 21E and 21F on one hand and the guided parts 42e on the other hand.

As opposed to the example of the electronic apparatus 1, the contact parts extending in the front-end direction may be formed on the guide parts 21E and 21F. In this case, the buttons 41 may have the contact parts, which are located at the back ends of the guided parts 42e, formed on the right and left flanks of the guided parts 42e respectively.

[Position of the Circuit Board]

Figure 3:
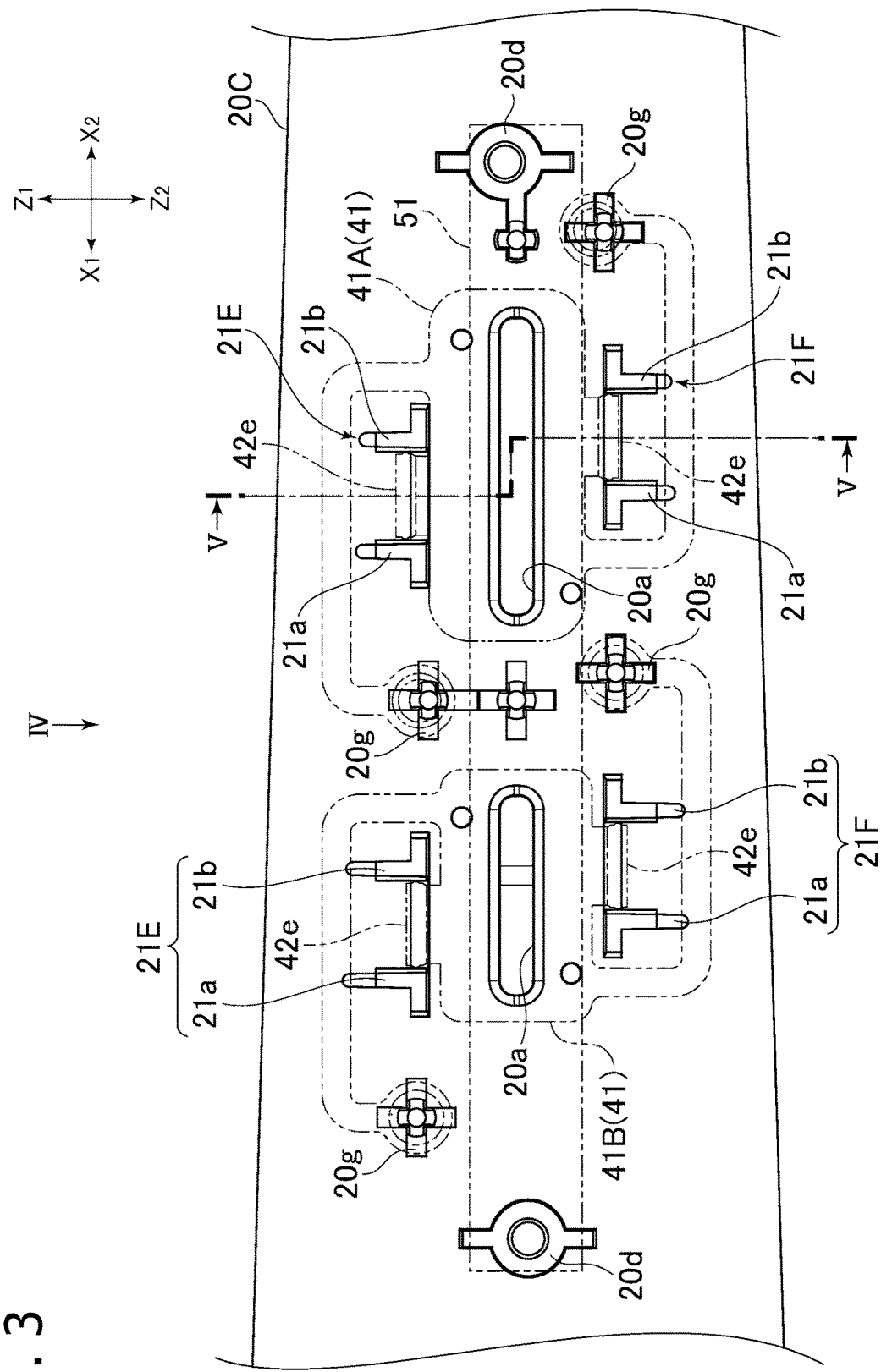
FIG. 3 is a view depicting a back side of the front panel.

The guided parts 42e are formed on the upper and lower edges of the button moving part 42 as described above. As indicated in FIG. 5, the circuit board 51 is disposed between the two guided parts 42e. The upper guided part 42e extends backward past the position of the upper edge of the circuit board 51. The lower guided part 42e extends backward past the position of the lower edge of the circuit board 51. As depicted in FIG. 3, the two guided parts 42e may be positionally displaced from each other in the horizontal direction or may positionally coincide with each other in the horizontal direction.

As depicted in FIG. 3, the circuit board 51 extends in the horizontal direction between the two guided parts 42e for the first button 41A on one hand and the two guided parts 42e for the second button 41B on the other hand. Both ends of the circuit board 51 are attached to two bosses (attaching parts) 20d on which the front panel 20C is formed (see FIG. 4A).

It is to be noted that the positional relation between the circuit board 51 and the guided parts 42e is not limited to that of the example of the electronic apparatus 1. Alternatively, an opening may be formed through the circuit board 51 in the front-back direction. The guided parts 42e may then extend backward through this opening. In this case, the guide parts 21E and 21F may also extend backward through the opening of the circuit board 51.

[Elastic Parts]

The buttons 41 have the elastic parts 43E and 43F as depicted in FIG. 6A. The elastic parts 43E and 43F are disposed symmetrically to each other with respect to a center point of the button moving part 42. At their ends, the elastic parts 43E and 43F are furnished respectively with fixing parts 43a attached to bosses 20g (attaching parts, see FIG. 3) formed on the back surface of the front panel 20C. Further, bases 43b of the elastic parts 43E and 43F are connected respectively to the upper and lower edges of the base 42b of the button moving part 42.

As depicted in FIG. 6A, when the buttons 41 are viewed in the front-back direction, the bases 43b and the fixing parts 43a are positioned opposite to one another across the guided parts 42e and 42f. With the buttons 41 viewed in the front-back direction, the elastic parts 43E and 43F present an approximate U-shape and extend in the horizontal direction past the positions of the guided parts 42e and 42f. This allows the elastic parts 43E and 43F to be sufficiently long, making it easier to reserve the movable range of the button moving part 42.

[Shield]

As depicted in FIG. 2, the electronic apparatus 1 has connectors 61A and 61B provided on its front surface. A circuit board 60 is disposed back of and in alignment with the front panel 20C (see FIG. 7B). The connectors 61A and 61B are mounted on a front surface 60a of the circuit board 60.

Figure 7A:
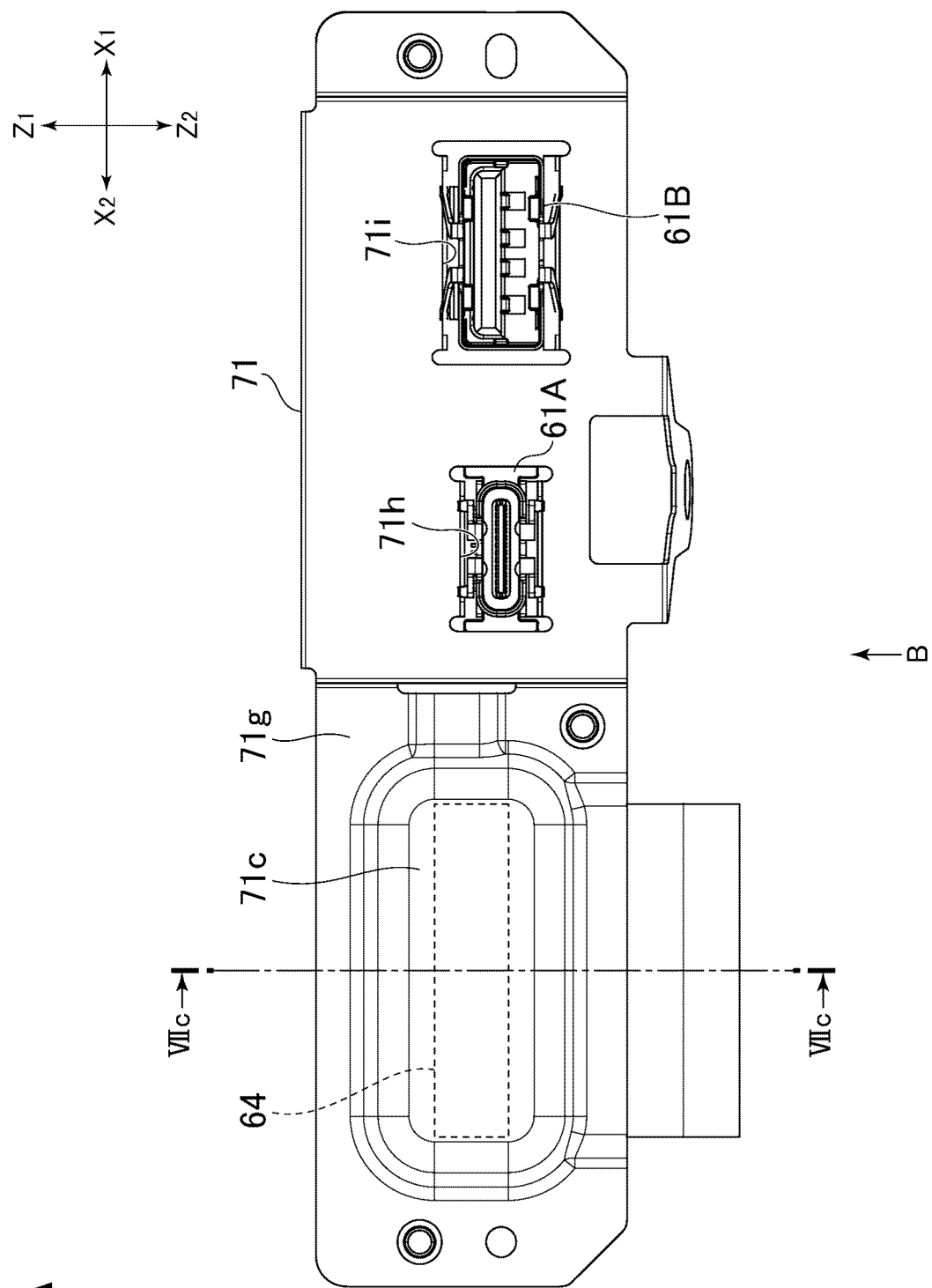
FIG. 7A is a front view of a connector substrate and a shield that covers it.

A flexible flat cable 63 is connected to the circuit board 60. As depicted in FIG. 7C, one end of the flat cable 63 is connected to a connector 64 mounted on the front surface 60a of the circuit board 60. On the underside of the connector 64 is an insertion opening 64a into which the flat cable 63 is inserted. The insertion opening 64a opens in a direction along the circuit board 60 (lower side in the illustrated example). The flat cable 63 extends from its end connected with the insertion opening 64a in a direction along the circuit board 60. It is by means of the flat cable 63 that the circuit board 60 is connected with the circuit board (main circuit board) on which the integrated circuits including the CPU are mounted.

As depicted in FIG. 7C, the electronic apparatus 1 has a shield 71 covering the front surface 60a of the circuit board 60. The shield 71 may be attached to the circuit board 60 by such fixing implements as screws. The connector 64 with which the flat cable 63 is connected is also covered by the shield 71.

As depicted in FIG. 7C, the shield 71 has a depressed edge part 71b that forms, in conjunction with the front surface 60a of the circuit board 60, the opening through which the flat cable 63 passes. A distance D6 from the front surface 60a of the circuit board 60 to the depressed edge part 71b is shorter than a height H1 of the insertion opening 64a in reference to the front surface 60a of the circuit board 60. The height H1 represents the distance from the front surface 60a of the circuit board 60 to the front-side edge of the insertion opening 64a. The flat cable 63 extends obliquely from the insertion opening 64a toward the front surface 60a of the circuit board 60. When structured in this manner, the shield 71 has only a limited gap between the flat cable 63 and the depressed edge part 71b. This effectively suppresses spurious radiation from the circuit board 60.

In the electronic apparatus 1, the distance D6 from the front surface 60a of the circuit board 60 to the depressed edge part 71b corresponds to the thickness of the flat cable 63. For this reason, the depressed edge part 71b may be in contact with the flat cable 63.

Figure 7B:
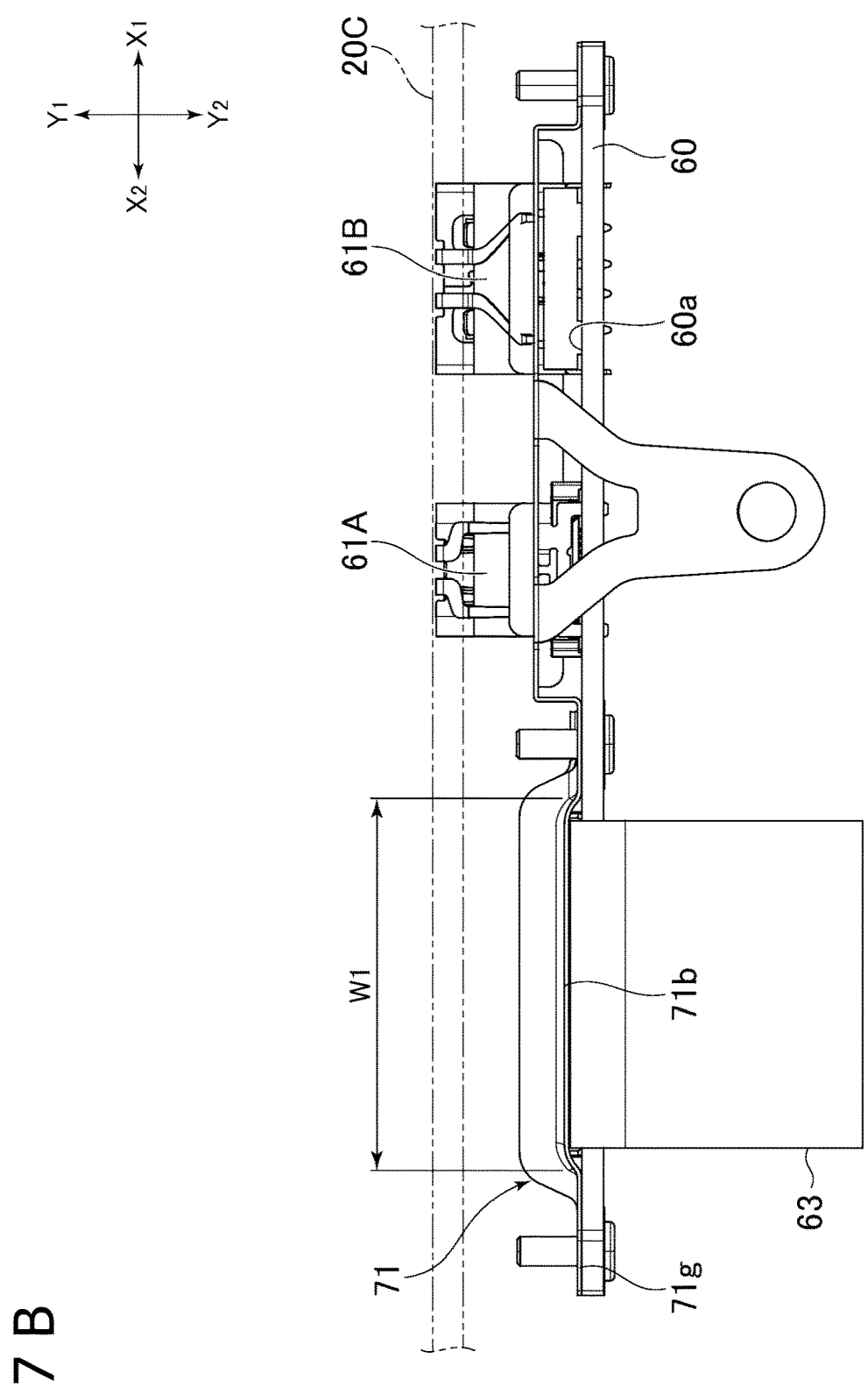
FIG. 7B is a bottom view of the connector substrate and other parts depicted in FIG. 7A (as viewed in the direction indicated by B in FIG. 7A).
Figure 7C:
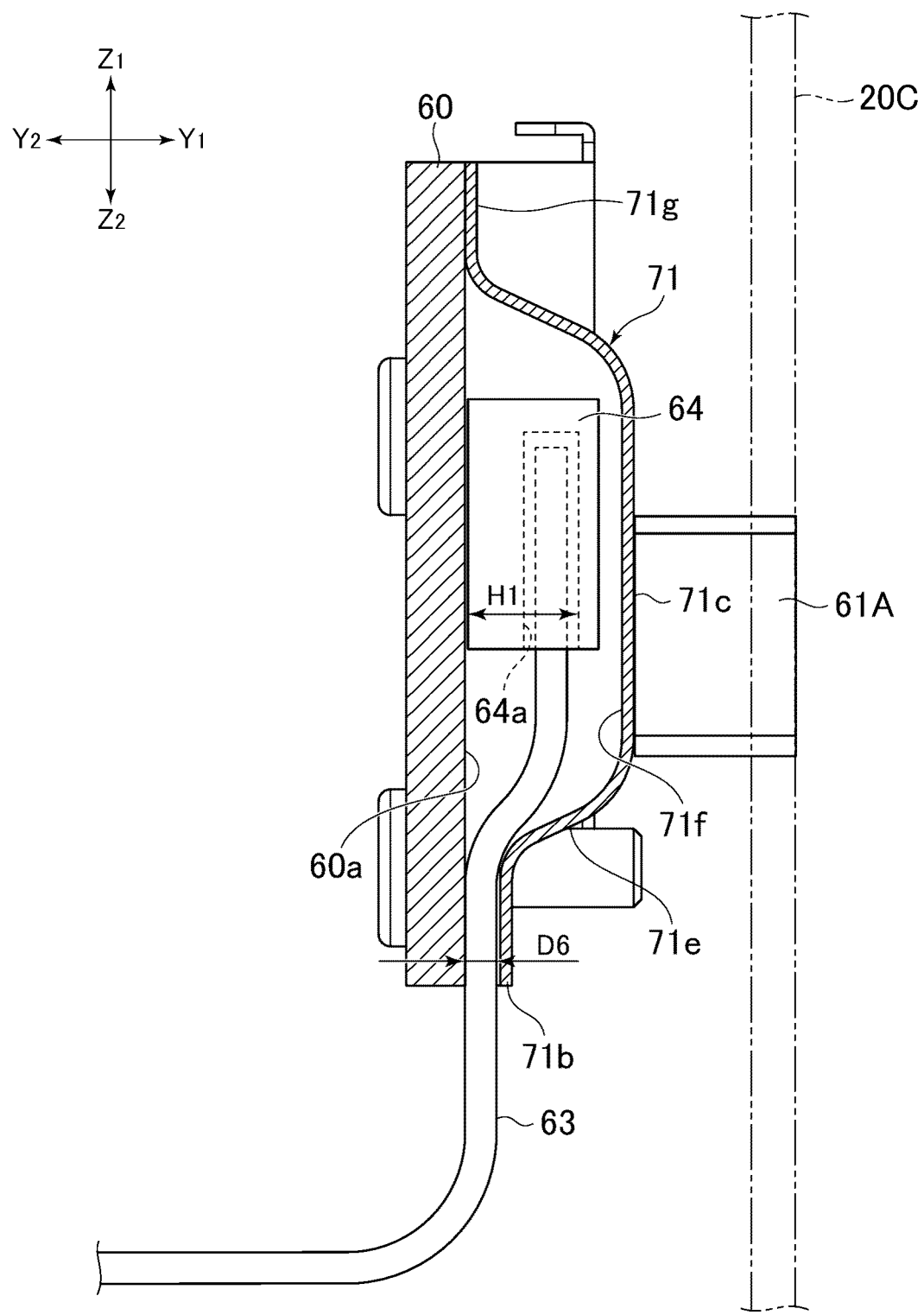
FIG. 7C is a cross-sectional view taken along line VIIc-VIIc illustrated in FIG. 7A.

As depicted in FIG. 7B, a width W1 of the depressed edge part 71b in the horizontal direction corresponds to the width of the flat cable 63. On the right and left sides of the depressed edge part 71b, the shield 71 is in contact with the front surface 60a of the circuit board 60.

As depicted in FIG. 7C, the shield 71 has a main plate part 71c and an inclined part 71e, the main plate part 71c being positioned in front of the connector 64 and covering it, the inclined part 71e extending obliquely from the main plate part 71c to the depressed edge part 71b in the direction of the front surface 60a of the circuit board 60. The inclined part 71e extends up to the depressed edge part 71b in a curved manner. The depressed edge part 71b further extends in a direction along the front surface 60a of the circuit board 60. The shield 71 has a back surface 71f facing the circuit board 60. A portion of the back surface 71f functions as the depressed edge part 71b. This shape of the shield 71, for example, reduces the load on the flat cable 63 even under the force pushing the front surface of the shield 71 toward the circuit board 60.

As depicted in FIGS. 7B and 7C, the shield 71 has a contact region 71g that surrounds the connector 64 around the main plate part 71c and that is in contact with the front surface 60a of the circuit board 60. The contact region 71g may be in contact with a ground region formed on the front surface 60a of the circuit board 60.

The shield 71 has openings 71h and 71i (see FIG. 7A) at the positions of the connectors 61A and 61B. From these openings 71h and 71i, the connectors 61A and 61B project out of the shield 71 (in front thereof).

CONCLUSION

As described above, the buttons 41A and 41B have the button moving part 42 disposed in front of the circuit board 51 and allowed to move in the front-back direction, and the guided parts 42e that move in conjunction with the button moving part 42. The buttons 41A and 41B cause the button moving part 42 to operate the switches 52 of the circuit board 51. The guide parts 21E and 21F are disposed along the guided parts 42e and restrict the direction in which the button moving part 42 moves. The guide parts 21E and 21F and the guided parts 42e have the portions located back of the front surface 51a of the circuit board 51. This structure increases the distance in the front-back direction from the opening 20a formed on the front panel 20C to the back ends of the guide parts 21E and 21F, thereby preventing the positions of the back ends of the buttons 41 (i.e., back ends of the guided parts 42e) from shifting in the horizontal direction, for example. As a result, the button moving part 42 is effectively prevented from tilting.

Note that the electronic apparatus proposed in the present disclosure is not limited structurally to what has been discussed above and may variously be modified in structure. For example, the positions of the guide parts 21E and 21F with respect to the button moving part 42 are not limited to those in the example of the electronic apparatus 1. The guide parts 21E and 21F may, for example, alternatively be formed on the right and left sides of the button moving part 42 respectively.

The invention claimed is:

1. An electronic apparatus, comprising:
a circuit board that includes a first surface facing in a first direction, a second surface facing in a second direction opposite to the first direction, and a switch mounted on the first surface;
a button that includes a moving part and a guided part, the moving part being disposed in the first direction with respect to the switch and allowed to move in the first direction and the second direction, the guided part moving in conjunction with the moving part, the button causing the moving part to operate the switch; and
a guide part that is formed along the guided part and restricts a direction in which the moving part moves, wherein:
the guide part and the guided part each have a portion positioned more in the second direction than the first surface of the circuit board,
an electrical part is disposed in the second direction with respect to the circuit board, and
a distance from the first surface of the circuit board to the electrical part is longer than a distance from an end of the guide part to the electrical part.

2. The electronic apparatus according to claim 1, wherein the electrical part is an antenna.

3. The electronic apparatus according to claim 1, wherein the guide part includes a first guide part and a second guide part separated from each other in a third direction intersecting the first direction, and
the guided part includes a first guided part and a second guided part flanking the moving part and being separated from each other in the third direction, the first guided part and the second guided part being guided by the first guide part and the second guide part respectively.

4. The electronic apparatus according to claim 3, wherein the circuit board is disposed between the first guided part and the second guided part.

5. The electronic apparatus according to claim 1, wherein the guide part extends in the second direction past the second surface of the circuit board.

6. The electronic apparatus according to claim 1, further comprising:
   a sheathing panel that is configured to cover the first surface of the circuit board and has an opening formed to partially expose the moving part,
   wherein the guide part extends in the second direction from the sheathing panel past the second surface of the circuit board.

7. The electronic apparatus according to claim 1, further comprising:
   a sheathing panel that is configured to cover the first surface of the circuit board and has an opening formed to partially expose the moving part,
   wherein a distance in the first direction from the first surface of the circuit board to an end of the guide part is greater than a thickness of the sheathing panel.

8. The electronic apparatus according to claim 1, wherein a distance in the first direction from the first surface of the circuit board to an end of the guide part is greater than a movable range of the moving part.

9. The electronic apparatus according to claim 1, wherein the button has an elastic part that is connected to the moving part and to a sheathing panel and that supports the moving part.

10. The electronic apparatus according to claim 9, wherein, when the button is viewed in the first direction, the elastic part extends in a fifth direction intersecting the first direction past the position of the guided part.

11. An electronic apparatus, comprising:
   a circuit board that includes a first surface facing in a first direction, a second surface facing in a second direction opposite to the first direction, and a switch mounted on the first surface;
   a button that includes a moving part and a guided part, the moving part being disposed in the first direction with respect to the switch and allowed to move in the first direction and the second direction, the guided part moving in conjunction with the moving part, the button causing the moving part to operate the switch; and
   a guide part that is formed along the guided part and restricts a direction in which the moving part moves, wherein:
   the guide part and the guided part each have a portion positioned more in the second direction than the first surface of the circuit board,
   one of the guide part and the guided part has a contact part projecting toward the other of the guide part and the guided part, and
   the contact part is positioned more in the second direction than in the first direction of the first surface of the circuit board.

12. The electronic apparatus according to claim 11, wherein the guide part includes a first guide part and a second guide part separated from each other in a third direction intersecting the first direction, and
   the guided part includes a first guided part and a second guided part flanking the moving part and being separated from each other in the third direction, the first guided part and the second guided part being guided by the first guide part and the second guide part respectively.

13. The electronic apparatus according to claim 11, further comprising:
   a sheathing panel that is configured to cover the first surface of the circuit board and has an opening formed to partially expose the moving part,
   wherein the guide part extends in the second direction from the sheathing panel past the second surface of the circuit board.

14. An electronic apparatus, comprising:
   a circuit board that includes a first surface facing in a first direction, a second surface facing in a second direction opposite to the first direction, and a switch mounted on the first surface;
   a button that includes a moving part and a guided part, the moving part being disposed in the first direction with respect to the switch and allowed to move in the first direction and the second direction, the guided part moving in conjunction with the moving part, the button causing the moving part to operate the switch; and
   a guide part that is formed along the guided part and restricts a direction in which the moving part moves, wherein:
   the guide part and the guided part each have a portion positioned more in the second direction than the first surface of the circuit board,
   the moving part has a base positioned in the first direction with respect to the first surface of the circuit board, and
   the guided part extends from the base in the second direction past the second surface of the circuit board.

15. The electronic apparatus according to claim 14, wherein the guide part includes a first guide part and a second guide part separated from each other in a third direction intersecting the first direction, and
   the guided part includes a first guided part and a second guided part flanking the moving part and being separated from each other in the third direction, the first guided part and the second guided part being guided by the first guide part and the second guide part respectively.

16. The electronic apparatus according to claim 14, further comprising:
   a sheathing panel that is configured to cover the first surface of the circuit board and has an opening formed to partially expose the moving part,
   wherein the guide part extends in the second direction from the sheathing panel past the second surface of the circuit board.

17. An electronic apparatus, comprising:
   a circuit board that includes a first surface facing in a first direction, a second surface facing in a second direction opposite to the first direction, and a switch mounted on the first surface;
   a button that includes a moving part and a guided part, the moving part being disposed in the first direction with respect to the switch and allowed to move in the first direction and the second direction, the guided part moving in conjunction with the moving part, the button causing the moving part to operate the switch;
   a guide part that is formed along the guided part and restricts a direction in which the moving part moves; and a sheathing panel that is configured to cover the first surface of the circuit board and has an opening formed thereon, wherein:

the guide part and the guided part each have a portion positioned more in the second direction than the first surface of the circuit board, the moving part of the button has an operable part disposed inside the opening of the sheathing panel, the operable part is shaped to be elongated in a fourth direction orthogonal to the first direction, and one of the guide part and the guided part flanks another of the guide part and the guided part in the fourth direction.

18. The electronic apparatus according to claim 17, wherein the guide part includes a first guide part and a second guide part separated from each other in a third direction intersecting the first direction, and the guided part includes a first guided part and a second guided part flanking the moving part and being separated from each other in the third direction, the first guided part and the second guided part being guided by the first guide part and the second guide part respectively.

19. The electronic apparatus according to claim 17, wherein the guide part extends in the second direction from the sheathing panel past the second surface of the circuit board.

* * * * *